United States Patent
Ha et al.

(10) Patent No.: US 8,970,279 B2
(45) Date of Patent: Mar. 3, 2015

(54) RADIO FREQUENCY SWITCH CIRCUIT

(71) Applicant: Samsung Electro-Mechanics Co., Ltd., Suwon, Gyunggi-do (KR)

(72) Inventors: Sang Hoon Ha, Gyunggi-do (KR); Sung Hwan Park, Gyunggi-do (KR); Sang Hee Kim, Gyunggi-do (KR); Nam Heung Kim, Gyunggi-do (KR); Hyo Gun Bae, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 50 days.

(21) Appl. No.: 13/779,675

(22) Filed: Feb. 27, 2013

(65) Prior Publication Data

US 2014/0176225 A1   Jun. 26, 2014

(30) Foreign Application Priority Data

Dec. 21, 2012   (KR) .......................... 10-2012-0151457

(51) Int. Cl.
*H03K 17/687* (2006.01)
*H03K 17/16* (2006.01)

(52) U.S. Cl.
CPC ..................................... *H03K 17/16* (2013.01)
USPC ............ 327/308; 327/427; 327/434; 327/435; 327/436

(58) Field of Classification Search
None
See application file for complete search history.

(56) References Cited

U.S. PATENT DOCUMENTS

| 5,406,151 | A | * | 4/1995 | Kusunoki | ....................... 327/427 |
| 5,455,544 | A | * | 10/1995 | Kechkaylo | ..................... 332/103 |
| 5,774,792 | A | * | 6/1998 | Tanaka et al. | ................... 455/78 |
| 5,777,530 | A | * | 7/1998 | Nakatuka | ...................... 333/104 |
| 6,094,088 | A | * | 7/2000 | Yano | .............................. 327/534 |
| 6,693,498 | B1 | * | 2/2004 | Sasabata et al. | .............. 333/103 |
| 6,804,502 | B2 | * | 10/2004 | Burgener et al. | ............. 455/333 |
| 6,978,122 | B2 | * | 12/2005 | Kawakyu et al. | ............... 455/80 |
| 7,123,898 | B2 |  | 10/2006 | Burgener et al. |  |

(Continued)

FOREIGN PATENT DOCUMENTS

| JP | 6-104718 A | 4/1994 |
| JP | 2007-259112 A | 10/2007 |
| KR | 2003-0081408 A | 10/2003 |

OTHER PUBLICATIONS

Office Action issued on Jan. 24, 2014 in the corresponding Korean patent application No. 10-2012-0151457.

(Continued)

*Primary Examiner* — Tuan T Lam (74) *Attorney, Agent, or Firm* — McDermott Will & Emery LLP (57) ABSTRACT

There is provided a radio frequency switch circuit including a first switch circuit unit connected between a first node connected to a first signal port and a common node connected to a common port, and operated according to a first control signal, a second switch circuit unit connected between a second node connected to a second signal port and the common node and operated according to a second control signal having a phase opposite to that of the first control signal, a first shunt circuit unit connected between the second node and a common source node and operated according to the first control signal, a second shunt circuit unit connected between the first node and the common source node, and a source voltage generating unit generating a source voltage, wherein the source voltage is lower than a high level of the first control signal and higher than a ground potential.

12 Claims, 7 Drawing Sheets

(56) References Cited

U.S. PATENT DOCUMENTS

| | | | |
|---|---|---|---|
| 7,636,004 B2* | 12/2009 | Nakatsuka et al. | 327/308 |
| 8,583,111 B2* | 11/2013 | Burgener et al. | 455/433 |
| 2004/0085118 A1 | 5/2004 | Numata | |
| 2006/0119451 A1* | 6/2006 | Chen | 333/103 |
| 2010/0225378 A1* | 9/2010 | Nakatsuka et al. | 327/434 |
| 2012/0218010 A1* | 8/2012 | Seshita | 327/109 |

OTHER PUBLICATIONS

Japanese Office Action issued in Application No. 2013-032465 dated Oct. 29, 2013.

* cited by examiner

RADIO FREQUENCY SWITCH CIRCUIT

CROSS-REFERENCE TO RELATED APPLICATIONS

This application claims the priority of Korean Patent Application No. 10-2012-0151457 filed on Dec. 21, 2012, in the Korean Intellectual Property Office, the disclosure of which is incorporated herein by reference.

BACKGROUND OF THE INVENTION

1. Field of the Invention

The present invention relates to a radio frequency switch circuit for reducing an influence of a deviation voltage of a switching control signal.

2. Description of the Related Art

In general, a semiconductor integrated circuit installed in a wireless communications device such as a cellular phone includes a radio frequency semiconductor switch (hereinafter, referred to as a radio frequency switch circuit) for controlling a transfer path of a high frequency signal between an antenna and a transmitting/receiving circuit.

Such a radio frequency switch circuit requires low loss, high isolation, and a high switching speed, and also requires low harmonic distortion, that is, high linearity, even in the case that a large signal is input.

In a basic wireless communication device, a radio frequency switch circuit includes a plurality of radio frequency ports that are connected to a plurality of transmitting/receiving circuits, respectively, and a common port connected to an antenna.

The radio frequency switch circuit controls a transfer path of a high frequency signal between the radio frequency ports and the common port such that one is selected from among the transmitting/receiving circuits connected to the radio frequency switch circuit and is electrically connected to the antenna.

Such an existing radio frequency switch circuit includes a switch transistor connected between each radio frequency port and the common port, and a shunt transistor connected between each radio frequency port and a ground in order to convert a transfer path of the high frequency signal between each radio frequency port and the common port.

In this case, each of the switch transistor and the shunt transistor may be a switch device on a silicon on insulator (SOI) substrate and may be a metal oxide silicon field effect transistor (MOSFET).

In such an existing radio frequency switch circuit, a switching control signal for controlling in an on-state or an off-state is supplied to a plurality of switches and a gate of each shunt transistor. The switching control signal may be supplied from a base band chipset.

However, the switching control signal supplied to the switch and shunt transistor included in the radio frequency switch circuit may not have a required voltage level and may have a deviation voltage that is different from the required voltage level. When the switching control signal has the deviation voltage, the deviation voltage may not be compensated for, thereby degrading switch properties.

For example, when a turn-on voltage of the shunt transistor is 0.45 V, in a case in which the control signal having a deviation voltage not 0 V is supplied to the gate of the shunt transistor as a low level for turn-off, the shunt transistor needs to be turned off. However, when a voltage (e.g., 0.3 V) that is lower than the turn-on voltage and equal to or higher than a sub_threshold voltage is applied to the gate, the shunt transistor may be slightly turned on.

Accordingly, loss of the radio frequency signal comes from the shunt transistor, thereby causing deterioration in return loss or harmonic characteristics in the radio frequency switch circuit.

The Related Art Document below discloses a radio frequency switch circuit and a semiconductor device but does not disclose technical features related to reducing the influence of a deviation voltage of a switching control signal.

RELATED ART DOCUMENT

Japanese Laid-Open Patent Publication No. 2007-259112

SUMMARY OF THE INVENTION

An aspect of the present invention provides a radio frequency switch circuit that reduces an influence of a deviation voltage of a switching control signal so as to perform a correct switching operation.

According to an aspect of the present invention, there is provided a radio frequency switch circuit including a first switch circuit unit connected between a first node connected to a first signal port and a common node connected to a common port, and operated according to a first control signal having a low or high level, a second switch circuit unit connected between a second node connected to a second signal port and the common node and operated according to a second control signal having a phase opposite to that of the first control signal, a first shunt circuit unit connected between the second node and a common source node and operated according to the first control signal, a second shunt circuit unit connected between the first node and the common source node and operated according to the second control signal, and a source voltage generating unit generating a source voltage to be applied to the common source node, wherein the source voltage is lower than a high level of the first control signal and higher than a ground voltage.

According to another aspect of the present invention, there is provided a radio frequency switch circuit including a first switch circuit unit including at least one switching transistor connected between a first node connected to a first signal port and a common node connected to a common port, and operated according to the first control signal, a second switch circuit unit including at least one switching transistor connected between a second node connected to a second signal port and the common node, for performing a switching operation complementarily to the first switch circuit unit according to a second control signal, a first shunt circuit unit including at least one shunt transistor connected between the second node and a common source node and operated according to the first control signal, a second shunt circuit unit including at least one shunt transistor connected between the first node and the common source node, for performing a switching operation complementarily to the first shunt circuit unit according to the second control signal, and a source voltage generating unit generating a source voltage to be applied to the common source node, wherein the source voltage is lower than a threshold voltage of the shunt transistor and is equal to or higher than a sub-threshold voltage of the shunt transistor.

A voltage level of the source voltage may correspond to a voltage level of a control signal having a low level from among the first control signal and the second control signal.

The source voltage generating unit may apply, to the common source node, the source voltage having the voltage level of the control signal having the low level from among the first control signal and the second control signal.

The source voltage generating unit may apply the source voltage having a voltage level of the first control signal to the common source node when the first control signal is at a low level, and the source voltage generating unit may apply the source voltage having a voltage level of the second control signal to the common source node when the second control signal is at a low level.

The source voltage generating unit may include a first voltage selecting unit supplying the first control signal, as the source voltage, to the common source node, when the second control signal is at a high level, a second voltage selecting unit supplying the second control signal, as the source voltage, to the common source node, when the first control signal is at a high level, and a voltage holder for maintaining a voltage of the common source node.

The source voltage generating unit may include a first voltage selecting unit including at least one transistor turned on so as to supply the first control signal to the common source node when the second control signal is at a high level, a second voltage selecting unit including at least one transistor turned on so as to supply the second control signal to the common source node when the first control signal is at a high level, and a voltage holder connected between the common source node and a ground and charged with the source voltage.

The source voltage generating unit may include a first voltage selecting unit including a first transistor connected between an input terminal of the first control signal and the common source node, the first transistor being turned on when the second control signal is at a high level, a second voltage selecting unit including a second transistor connected between an input terminal of the second control signal and the common source node, the second transistor being turned on when the first control signal is at a high level, and a voltage holder including a capacitor connected between the common source node and a ground, the capacitor being charged with the source voltage.

The source voltage generating unit may include a first voltage selecting unit including a first transistor group including a plurality of transistors arranged to constitute a stack structure between an input terminal of the first control signal and the common source node, the first transistor group being turned on when the second control signal is at a high level, a second voltage selecting unit including a second transistor group including a plurality of transistors arranged to constitute a stack structure between an input terminal of the second control signal and the common source node, the second transistor group being turned on when the first control signal is at a high level, and a voltage holder including a capacitor connected between the common source node and a ground, the capacitor being charged with the source voltage.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
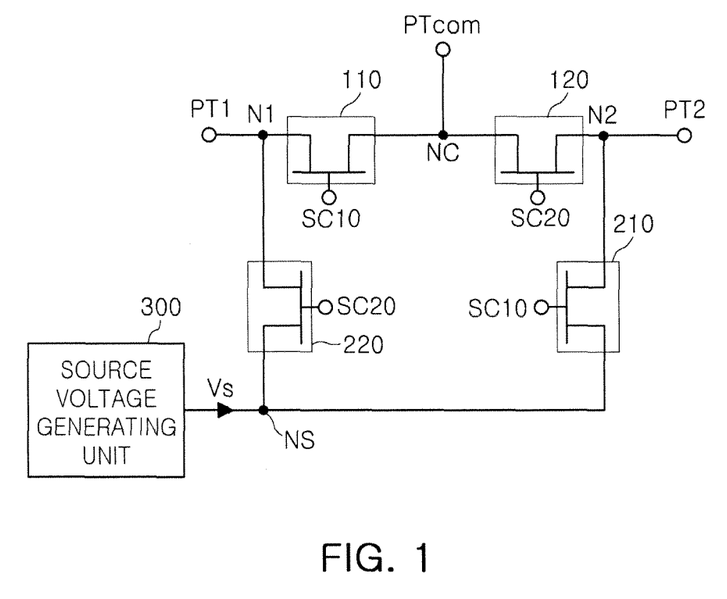
FIG. 1 is a block diagram of a radio frequency switch circuit according to an embodiment of the present invention.

FIG. 1 is a block diagram of a radio frequency switch circuit according to an embodiment of the present invention.

Referring to FIG. 1, the radio frequency switch circuit according to the preset embodiment may include a first switch circuit unit 110, a second switch circuit unit 120, a first shunt circuit unit 210, a second shunt circuit unit 220, and a source voltage generating unit 300.

The first switch circuit unit 110 may be connected between a first node N1 connected to a first signal port PT1 and a common node NC connected to a common port PTcom and may operate according to a first control signal SC10 having a low level or a high level.

The second switch circuit unit 120 may be connected between a second node N2 connected to a second signal port PT2 and the common node NC and may operate in response to a second control signal SC20 having a phase opposite to that of the first control signal SC10.

In this case, the first signal port PT1 and the second signal port PT2 are ports connected to a radio frequency (RF) circuit unit in order to transmit or receive an RF signal. The common port PTcom is a port connected to an antenna.

The first shunt circuit unit 210 may be connected between the second node N2 and a common source node NS and may operate according to the first control signal SC10.

The second shunt circuit unit 220 may be connected between the first node N1 and the common source node NS and may operate according to the second control signal SC20.

When the first switch circuit unit 110 is enabled (turned on) according to the first control signal SC10, the first shunt circuit unit 210 may be enabled, and the second switch circuit unit 120 and the second shunt circuit unit 220 may be respectively disabled (turned off).

On the other hand, when the second switch circuit unit 120 is enabled according to the second control signal SC20, the second shunt circuit unit 220 is enabled, and the first switch circuit unit 110 and the second shunt circuit unit 220 may be respectively disabled.

The source voltage generating unit 300 may generate a source voltage Vs to be applied to the common source node NS. In this case, the source voltage Vs may be lower than a high level of the first control signal SC10 and may exceed a ground potential.

As described above, the source voltage Vs is applied to the common source node NS, in order to prevent the first and second shunt circuit units 210 and 220 from being enabled (being turned on) when one of the first and second control signals SC10 and SC20 is at a low level but is at a voltage level that is not a ground level and that is higher than the ground level.

In detail, the source voltage generating unit 300 may apply the source voltage Vs having a voltage level of a control signal having a low level from among the first control signal SC10 and the second control signal SC20, to the common source node NS.

In detail, when the first control signal SC10 is at a low level, the source voltage generating unit 300 may apply the source voltage Vs having a voltage level of the first control signal SC10 to the common source node NS. When the second control signal SC20 is at a low level, the source voltage Vs having the voltage level of the second control signal SC20 may be applied to the common source node NS.

Figure 2:
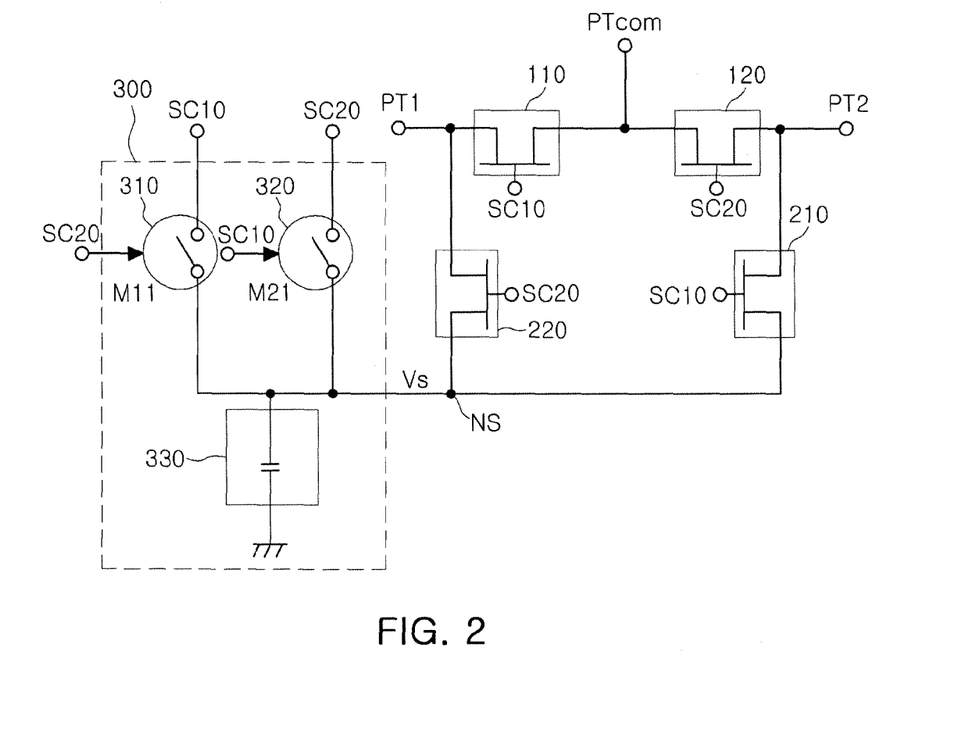
FIG. 2 is a diagram of an internal structure of a source voltage generating unit according to an embodiment of the present invention.

FIG. 2 is a diagram of an internal structure of a source voltage generating unit which is designated by a numeral reference 300, according to an embodiment of the present invention.

Referring to FIG. 2, the source voltage generating unit 300 may include a first voltage selecting unit 310, a second voltage selecting unit 320, and a voltage holder 330.

When the second control signal SC20 is at a high level, the first voltage selecting unit 310 may supply the first control signal SC10, as the source voltage Vs, to the common source node NS.

For example, when the first voltage selecting unit 310 includes a semiconductor switch, in the case in which the second control signal SC20 is at a high level, the first voltage selecting unit 310 is turned on such that the first control signal SC10 may be supplied to the common source node NS.

When the first control signal SC10 is at a high level, the second voltage selecting unit 320 may supply the second control signal SC20, as the source voltage Vs, to the common source node NS.

For example, when the second voltage selecting unit 320 is configured of a semiconductor switch, in the case in which the first control signal SC10 is at a high level, the second voltage selecting unit 320 is turned on such that the second control signal SC20 may be supplied to the common source node NS.

The voltage holder 330 may maintain a voltage of the common source node NS.

Figure 3:
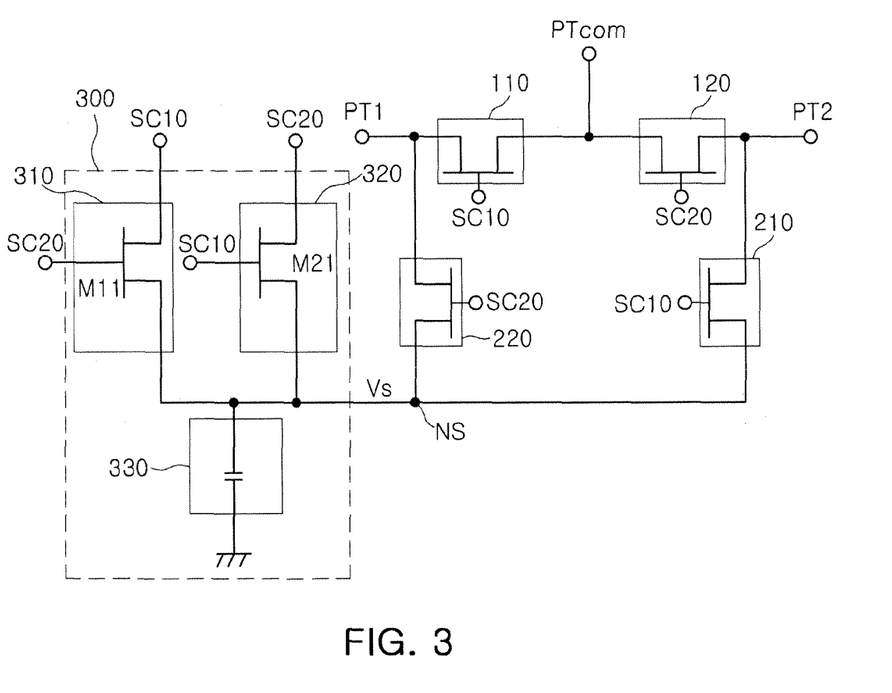
FIG. 3 is a circuit diagram of a source voltage generating unit according to a first embodiment of the present invention.
Figure 4:
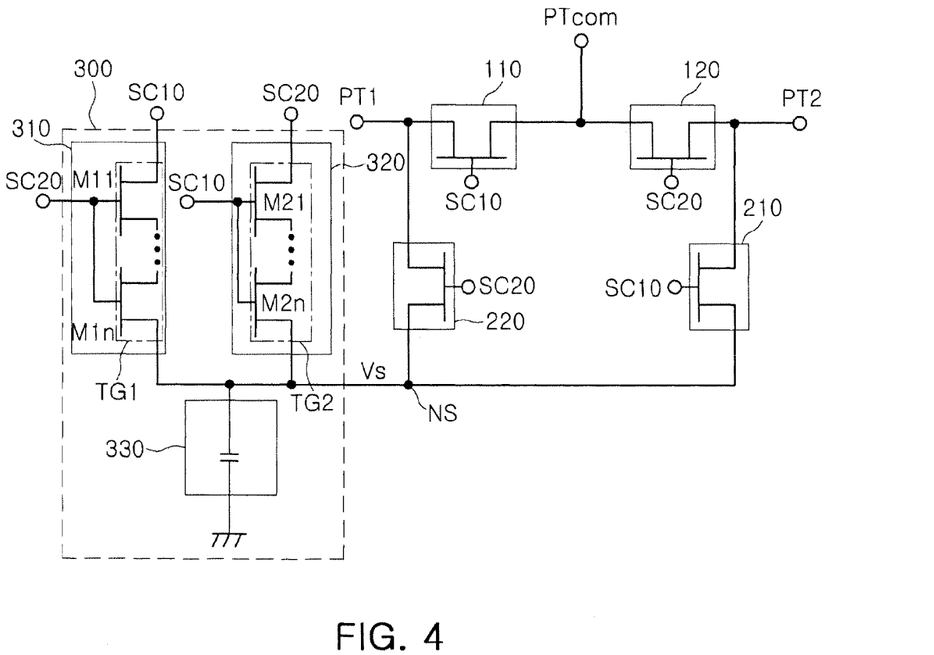
FIG. 4 is a circuit diagram of a source voltage generating unit according to a second embodiment of the present invention.

FIG. 3 is a circuit diagram of a source voltage generating unit according to a first embodiment of the present invention. FIG. 4 is a circuit diagram of a source voltage generating unit according to a second embodiment of the present invention.

Referring to FIGS. 3 and 4, the first voltage selecting unit 310 may include at least one transistor that is turned on so as to supply the first control signal SC10 to the common source node NS when the second control signal SC20 is at a high level.

The second voltage selecting unit 320 may include at least one transistor that is turned on so as to supply the second control signal SC20 to the common source node NS when the first control signal SC10 is at a high level.

The voltage holder 330 may include a capacitor connected between the common source node NS and a ground. The capacitor may be charged with the source voltage Vs.

Referring to FIG. 3, the first voltage selecting unit 310 may include a first transistor M11 connected between an input terminal of the first control signal SC10 and the common source node NS. In this case, the first transistor M11 may be turned on when the second control signal SC20 is at a high level and may be turned off when the second control signal SC20 is at a low level.

The second voltage selecting unit 320 may include a second transistor M21 connected between an input terminal of the second control signal SC20 and the common source node NS. In this case, the second transistor M21 may be turned on when the first control signal SC10 is at a high level and may be turned off when the first control signal SC10 is at a low level.

Referring to FIG. 4, the first voltage selecting unit 310 may include a first transistor group TG1 including a plurality of transistors M11 to M1n that are arranged to have a stack structure between the input terminal of the first control signal SC10 and the common source node NS. In this case, the first transistor group TG1 may be turned on when the second control signal SC20 is at a high level and may be turned off when the second control signal SC20 is at a low level.

The second voltage selecting unit 320 may include a second transistor group TG2 including a plurality of transistors M21 and M2n that are arranged to constitute a stack structure between the input terminal of the second control signal SC20 and the common source node NS. In this case, the second transistor group TG2 may be turned on when the first control signal SC10 is at a high level and may be turned off when the first control signal SC10 is at a low level.

Referring to FIGS. 1 through 4, the first switch circuit unit 110 may include at least one switching transistor that is connected between the first node N1 connected to the first signal port PT1 and the common node NC connected to the common port PTcom. In this case, the at least one switching transistor of the first switch circuit unit 110 may perform a switching operation complementarily to the first switch circuit unit 110 according to the first control signal SC10.

The second switch circuit unit 120 may include at least one switching transistor that is connected between the second node N2 connected to the second signal port PT2 and the common node NC. In this case, the at least one switching transistor of the second switch circuit unit 120 may perform a switching operation complementarily to the first switch circuit unit 110 according to the second control signal SC20.

The first shunt circuit unit 210 may include at least one shunt transistor connected between the second node N2 and the common source node NS. In this case, the at least one shunt transistor of the first shunt circuit unit 210 may be operated according to the first control signal SC10.

The second shunt circuit unit 220 may include at least one shunt transistor connected between the first node N1 and the common source node NS. In this case, the at least one shunt transistor of the second shunt circuit unit 220 may perform a switching operation complementarily to the first shunt circuit unit 210 according to the second control signal SC20.

In addition, the source voltage generating unit 300 may generate a preset source voltage Vs and may apply the preset source voltage Vs to the common source node NS. In this case, the source voltage Vs may be lower than a threshold voltage of the shunt transistor and may be equal to or higher than a sub-threshold voltage of the shunt transistor.

Figure 5:
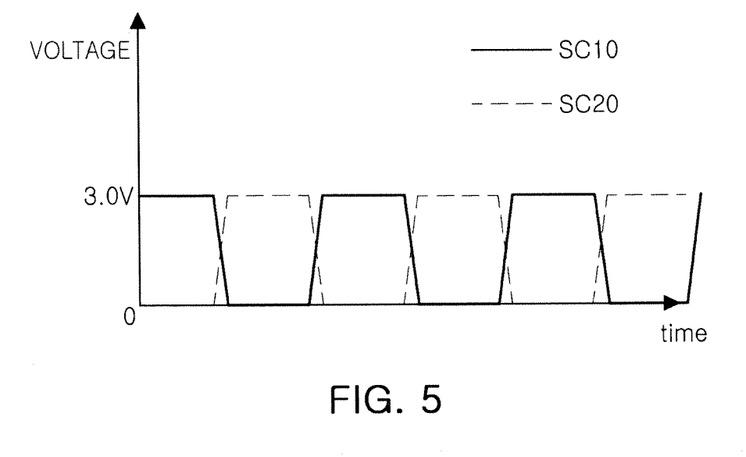
FIG. 5 is a diagram illustrating examples of first and second control signals, according to an embodiment of the present invention.

FIG. 5 is a diagram illustrating examples of the first and second control signals SC10 and SC20, according to an embodiment of the present invention.

Referring to FIG. 5, the first and second control signals SC10 and SC20 are preset pulse signals having a preset high level and a preset low level, respectively, have appropriate dead times, and have phases opposite to each other.

Specifically, when high levels of the first and second control signals SC10 and SC20 are the same and low levels of the first and second control signals SC10 and SC20 are the same, the high level may be 3.0 V and the low level may be 0 V.

Figure 6:
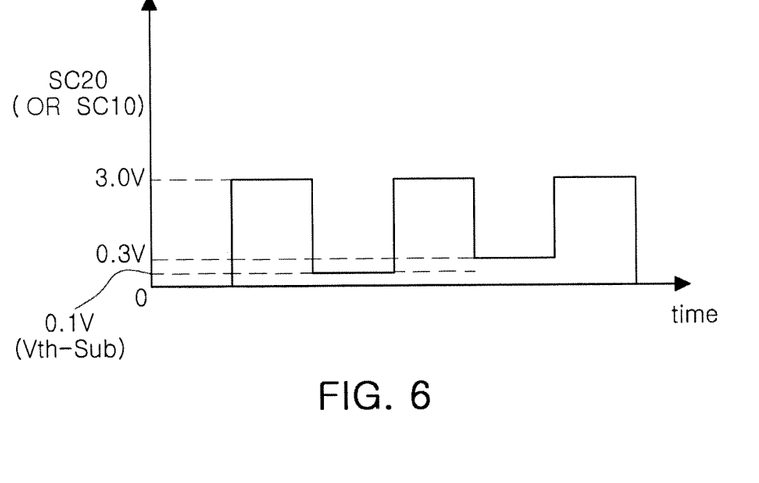
FIG. 6 is a diagram illustrating an example of an actual first or second control signal, according to an embodiment of the present invention.

FIG. 6 is a diagram illustrating an example of an actual first or second control signal, according to an embodiment of the present invention.

Referring to FIG. 6, an actual low level of the first control signal SC10 or the second control signal SC20 may not be 0 V and may be higher than 0V.

As seen from FIG. 6, for example, a low level of the first control signal SC10 or the second control signal SC20 is 0.3 V that is equal to or higher than a sub-threshold voltage of a general transistor, that is, 0.1 V.

Figure 7:
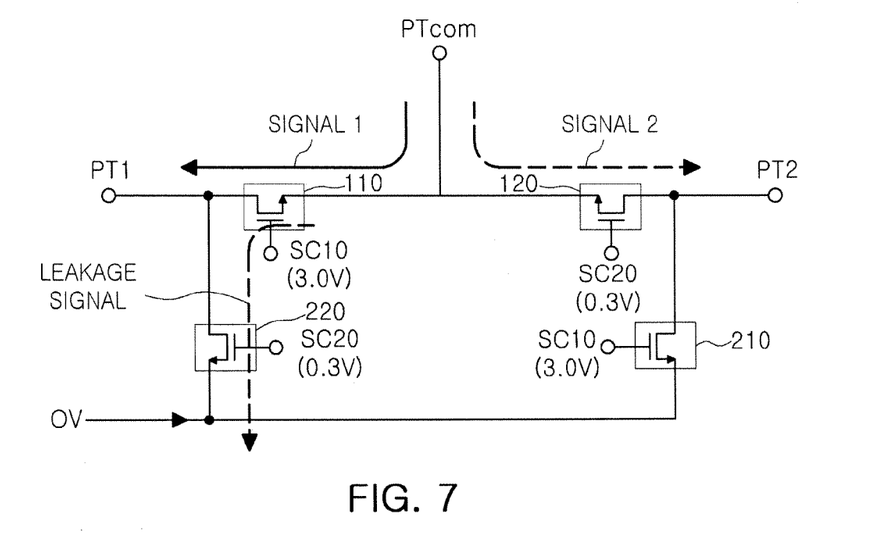
FIG. 7 is a diagram for explaining generation of a leakage signal from a radio frequency switch circuit according to an embodiment of the present invention.

FIG. 7 is a diagram of explaining generation of a leakage signal from a radio frequency switch circuit according to an embodiment of the present invention.

Referring to FIG. 7, when the source voltage generating unit 300 does not apply the source voltage Vs and 0 V is applied to the common source node NS, in the case in which the second control signal SC20 having a voltage (e.g., 0.3 V) that is equal to or higher than a sub-threshold voltage, that is, 0.1 V, is supplied to the at least one shunt transistor of the first shunt circuit unit 210, the at least one shunt transistor of the first shunt circuit unit 210 is turned on such that a leakage signal may flow therethrough.

Figure 8:
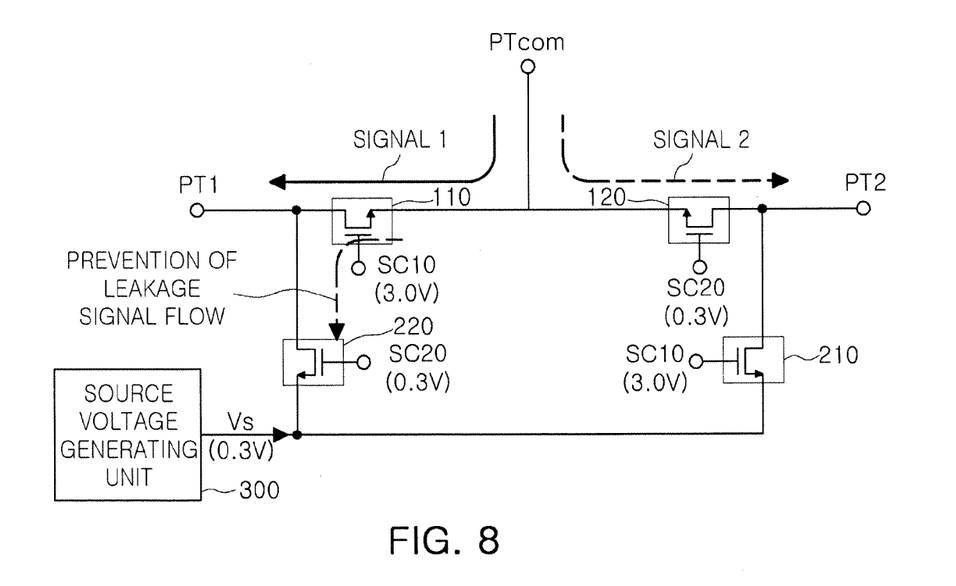
FIG. 8 is a diagram for explaining prevention of a leakage signal flow in a radio frequency switch circuit according to an embodiment of the present invention.

FIG. 8 is a diagram for explaining prevention of a leakage signal flow in a radio frequency switch circuit according to an embodiment of the present invention.

Referring to FIG. 8, when the source voltage generating unit 300 applies the source voltage Vs, in the case in which the source voltage Vs (e.g., 0.3 V) is equal to a voltage level (e.g., 0.3 V) of the second control signal (SC20), the at least one shunt transistor of the second shunt circuit unit 220 may be maintained as a complete off state.

Accordingly, a flow of signal 1 is blocked by the second shunt circuit unit 220 that is turned off, and thus, a leakage signal may not flow. To this contrary, when the first shunt circuit unit 210 is turned off, a flow of signal 2 is blocked by the first shunt circuit 210 and thus a leakage signal may not flow.

Figure 9:
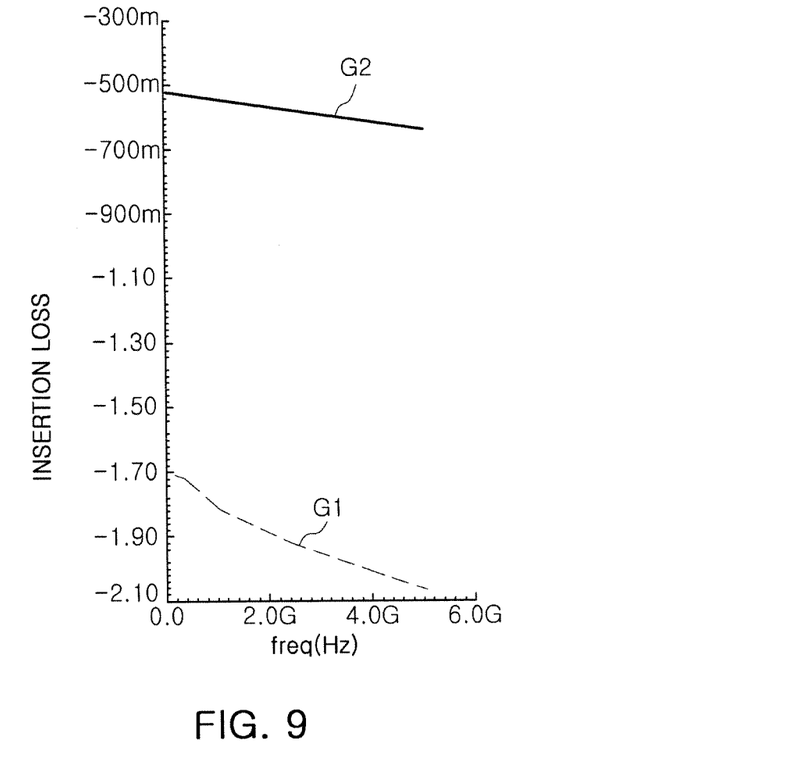
FIG. 9 is a graph showing return loss of a radio frequency switch circuit according to an embodiment of the present invention.

FIG. 9 is a graph showing return loss of a radio frequency switch circuit according to an embodiment of the present invention.

Referring to FIG. 9, G1 denotes return loss at an existing radio frequency switch circuit without a source voltage generating unit and G2 denotes return loss at a radio frequency switch circuit including a source voltage generating unit according to an embodiment of the present invention.

As seen from G1 and G2 of FIG. 9, the return loss according to the embodiment of the present invention is significantly improved. For example, return loss at a frequency of 4 GHz is about 2.00 dB at G1 and is about 0.60 dB at G2.

According to the embodiment of the present invention, influence of a deviation voltage of a switching control signal may be reduced so as to perform a correct switching operation.

While the present invention has been shown and described in connection with the embodiments, it will be apparent to those skilled in the art that modifications and variations can be made without departing from the spirit and scope of the invention as defined by the appended claims.

What is claimed is:

1. A radio frequency switch circuit, comprising:
a first switch circuit unit connected between a first node connected to a first signal port and a common node connected to a common port, and operated according to a first control signal having a low or high level;
a second switch circuit unit connected between a second node connected to a second signal port and the common node and operated according to a second control signal having a phase opposite to that of the first control signal;
a first shunt circuit unit connected between the second node and a common source node and operated according to the first control signal;
a second shunt circuit unit connected between the first node and the common source node and operated according to the second control signal; and
a source voltage generating unit generating a source voltage to be applied to the common source node,
wherein the source voltage has a voltage level equal to that of a control signal having a low level from among the first control signal and the second control signal, and higher than a ground potential.

2. The radio frequency switch circuit of claim 1, wherein the source voltage generating unit applies the source voltage having a voltage level of the first control signal to the common source node when the first control signal is at a low level, and the source voltage generating unit applies the source voltage having a voltage level of the second control signal to the common source node when the second control signal is at a low level.

3. The radio frequency switch circuit of claim 1, wherein the source voltage generating unit includes:
a first voltage selecting unit supplying the first control signal, as the source voltage, to the common source node, when the second control signal is at a high level;
a second voltage selecting unit supplying the second control signal, as the source voltage, to the common source node, when the first control signal is at a high level; and
a voltage holder for maintaining a voltage of the common source node.

4. The radio frequency switch circuit of claim 1, wherein the source voltage generating unit includes:
a first voltage selecting unit including at least one transistor turned on so as to supply the first control signal to the common source node when the second control signal is at a high level;
a second voltage selecting unit including at least one transistor turned on so as to supply the second control signal to the common source node when the first control signal is at a high level; and
a voltage holder connected between the common source node and a ground and charged with the source voltage.

5. The radio frequency switch circuit of claim 1, wherein the source voltage generating unit includes:
a first voltage selecting unit including a first transistor connected between an input terminal of the first control signal and the common source node, the first transistor turned on when the second control signal is at a high level;
a second voltage selecting unit including a second transistor connected between an input terminal of the second control signal and the common source node, the second transistor being turned on when the first control signal is at a high level; and
a voltage holder including a capacitor connected between the common source node and a ground, the capacitor being charged with the source voltage.

6. The radio frequency switch circuit of claim 1, wherein the source voltage generating unit includes:
- a first voltage selecting unit including a first transistor group having a plurality of transistors arranged to constitute a stack structure between an input terminal of the first control signal and the common source node, the first transistor group being turned on when the second control signal is at a high level;
- a second voltage selecting unit including a second transistor group having a plurality of transistors arranged to constitute a stack structure between an input terminal of the second control signal and the common source node, the second transistor group being turned on when the first control signal is at a high level; and
- a voltage holder including a capacitor connected between the common source node and a ground, the capacitor being charged with the source voltage.

7. A radio frequency switch circuit, comprising:
- a first switch circuit unit including at least one switching transistor connected between a first node connected to a first signal port and a common node connected to a common port, and operated according to the first control signal;
- a second switch circuit unit including at least one switching transistor connected between a second node connected to a second signal port and the common node, for performing a switching operation complementarily to the first switch circuit unit according to a second control signal;
- a first shunt circuit unit including at least one shunt transistor connected between the second node and a common source node and operated according to the first control signal;
- a second shunt circuit unit including at least one shunt transistor connected between the first node and the common source node, for performing a switching operation complementarily to the first shunt circuit unit according to the second control signal; and
- a source voltage generating unit generating a source voltage to be applied to the common source node,
- wherein the source voltage has a voltage level equal to that of a control signal having a low level from among the first control signal and the second control signal, and is equal to or higher than a sub-threshold voltage of he shunt transistor.

8. The radio frequency switch circuit of claim 7, wherein the source voltage generating unit applies the source voltage having a voltage level of the first control signal to the common source node when the first control signal is at a low level, and the source voltage generating unit applies the source voltage having a voltage level of the second control signal to the common source node when the second control signal is at a low level.

9. The radio frequency switch circuit of claim 7, wherein the source voltage generating unit includes:
- a first voltage selecting unit supplying the first control signal, as the source voltage, to the common source node, when the second control signal is at a high level;
- a second voltage selecting unit supplying the second control signal, as the source voltage, to the common source node, when the first control signal is at a high level; and
- a voltage holder for maintaining a voltage of the common source node.

10. The radio frequency switch circuit of claim 7, wherein the source voltage generating unit includes:
- a first voltage selecting unit including at least one transistor turned on so as to supply the first control signal to the common source node when the second control signal is at a high level;
- a second voltage selecting unit including at least one transistor turned on so as to supply the second control signal to the common source node when the first control signal is at a high level; and
- a voltage holder connected between the common source node and a ground and charged with the source voltage.

11. The radio frequency switch circuit of claim 7, wherein the source voltage generating unit includes:
- a first voltage selecting unit including a first transistor connected between an input terminal of the first control signal and the common source node, the first transistor being turned on when the second control signal is at a high level;
- a second voltage selecting unit including a second transistor connected between an input terminal of the second control signal and the common source node, the second transistor being turned on when the first control signal is at a high level; and
- a voltage holder including a capacitor connected between the common source node and a ground, the capacitor being charged with the source voltage.

12. The radio frequency switch circuit of claim 7, wherein the source voltage generating unit includes:
- a first voltage selecting unit including a first transistor group having a plurality of transistors arranged to constitute a stack structure between an input terminal of the first control signal and the common source node, the first transistor group being turned on when the second control signal is at a high level;
- a second voltage selecting unit including a second transistor group having a plurality of transistors arranged to constitute a stack structure between an input terminal of the second control signal and the common source node, the second transistor group being turned on when the first control signal is at a high level; and
- a voltage holder including a capacitor connected between the common source node and a ground, the capacitor being charged with the source voltage.

* * * * *